(12) United States Patent
Hellring et al.

(10) Patent No.: US 6,656,241 B1
(45) Date of Patent: Dec. 2, 2003

(54) SILICA-BASED SLURRY

(75) Inventors: Stuart D. Hellring, Pittsburgh, PA (US); Colin P. McCann, Pittsburgh, PA (US); Charles F. Kahle, Pittsburgh, PA (US); Yuzhuo Li, Potsdam, NY (US); Jason Keleher, Schenectady, NY (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 09/882,548

(22) Filed: Jun. 14, 2001

(51) Int. Cl.[7] ............................... G09G 1/02; G09G 1/07
(52) U.S. Cl. ............................... 51/308; 106/3; 438/692; 438/693; 216/99; 216/105; 216/96
(58) Field of Search .................... 51/308; 106/3; 438/692, 693; 252/79.1; 510/397, 395; 216/89, 96, 99, 105

(56) References Cited

U.S. PATENT DOCUMENTS

| | | | |
|---|---|---|---|
| 1,110,331 A | 9/1914 | McLean | |
| 2,786,042 A | 3/1957 | Iler | 260/37 |
| 3,334,062 A | 8/1967 | Brown et al. | 260/37 |
| 3,634,288 A | 1/1972 | Youngs | 252/358 |
| 3,720,532 A | 3/1973 | Simpson et al. | 106/308 Q |
| 3,768,537 A | 10/1973 | Hess et al. | 152/330 |
| 4,015,031 A | 3/1977 | Reinhardt et al. | 427/213 |
| 4,068,024 A | 1/1978 | Laufer | 427/220 |
| 4,143,027 A | 3/1979 | Sollman et al. | 260/42.15 |
| 4,208,213 A * | 6/1980 | Muller et al. | 106/10 |
| 4,443,357 A | 4/1984 | Maloney et al. | 252/321 |
| 4,554,147 A | 11/1985 | Stoll | 423/335 |
| 4,664,679 A | 5/1987 | Kohyama et al. | 51/308 |
| 4,849,022 A | 7/1989 | Kobayashi et al. | 106/490 |
| 5,008,305 A | 4/1991 | Kennan et al. | 523/212 |
| 5,226,930 A * | 7/1993 | Sasaki | 106/287.11 |
| 5,353,999 A | 10/1994 | Dew et al. | 241/30 |
| 5,374,434 A * | 12/1994 | Clapp et al. | 426/116 |
| 5,647,962 A | 7/1997 | Jansen et al. | 203/57 |
| 5,720,551 A | 2/1998 | Shechter | 366/147 |
| 5,739,197 A | 4/1998 | Swift et al. | 524/492 |
| 5,767,016 A | 6/1998 | Muroyama | 438/693 |
| 5,789,514 A | 8/1998 | Burns et al. | 528/12 |
| 5,876,490 A * | 3/1999 | Ronay | 106/3 |
| 5,888,467 A | 3/1999 | Swift et al. | 423/335 |
| 5,902,635 A | 5/1999 | Garafalo et al. | 427/212 |
| 5,902,636 A | 5/1999 | Grabbe et al. | 427/221 |
| 5,904,159 A | 5/1999 | Kato et al. | 134/7 |
| 5,908,660 A | 6/1999 | Griffith et al. | 427/220 |
| 5,911,963 A | 6/1999 | Krivak et al. | 423/335 |
| 5,919,298 A | 7/1999 | Griffith et al. | 106/490 |
| 5,980,775 A | 11/1999 | Grumbine et al. | 252/79.1 |
| 6,086,669 A | 7/2000 | Patkar et al. | 106/491 |
| 6,136,711 A | 10/2000 | Grumbine et al. | 438/692 |
| 2002/0106900 A1 | 8/2002 | Vogt et al. | 438/694 |

FOREIGN PATENT DOCUMENTS

| | | |
|---|---|---|
| EP | 1 020 0488 A2 | 7/2000 |
| EP | 1 116 762 A1 | 7/2001 |
| EP | 1 211 719 A1 | 6/2002 |
| WO | WO 99/64527 | 12/1999 |
| WO | WO 00/00567 | 1/2000 |
| WO | WO 00/39056 | 7/2000 |
| WO | WO 01/04226 A2 | 1/2001 |
| WO | WO 01/12730 A1 | 2/2001 |
| WO | WO 01/32794 A1 | 5/2001 |
| WO | WO 01/44402 A1 | 6/2001 |

OTHER PUBLICATIONS

R. K. Iler, The Chemical Of Silica, 1979, John Wiley & Sons, New York, Chapter 5 no month.

J. H. Perry, Chemical Engineers' Handbook, 4th Edition, McGraw–Hill Book Company, N.Y. (1963), pp. 8–42, and 8–43 (no month).

W. L. McCabe and J. C. Smith, Unit Operations of Chemical Engineering, 3rd Ed., McGraw–Hill Book Company, N.Y. (1976), pp. 844 and 845 (no month).

F. E. Albus, "The Modern Fluid Energy Mill", Chemical Engineering Progress, vol. 60, No. 6 (Jun. 1964), pp. 102–106.

* cited by examiner

*Primary Examiner*—Michael Marcheschi
(74) *Attorney, Agent, or Firm*—Carol A. Marmo (57) ABSTRACT

This invention relates to a slurry composition and a method of its preparation. In particular, the slurry composition of the present invention includes a silica wherein the silica comprises a surface modification. The silica-based slurry of the present invention is suitable for polishing articles and especially useful for chemical-mechanical planarization ("CMP") of semiconductor and other microelectronic substrates.

29 Claims, 3 Drawing Sheets

SILICA-BASED SLURRY

DESCRIPTION OF THE INVENTION

This invention relates to a slurry composition and a method of its preparation. In particular, the slurry composition of the present invention includes a silica wherein the silica comprises a surface modification. The silica-based slurry of the present invention is suitable for polishing articles and especially useful for chemical-mechanical planarization ("CMP") of semiconductor and other microelectronic substrates.

In general, a plurality of integrated circuits is formed on a semiconductor substrate in fabricating a semiconductor wafer. The integrated circuits are typically formed by a series of process steps in which patterned layers of materials, such as conductive, insulating and semiconducting materials, are formed on the substrate. The use of copper and tantalum metal interconnects on semiconductor substrates is known in the art. In general, copper serves as an electrically conductive interconnection that is surrounded by an insulating interlayer dielectric material (ILD) such silicon dioxide, and tantalum serves as a barrier between copper and the ILD to prevent copper migration into the ILD. CMP is a technique known for removing such metallic materials from a semiconductor wafer. The control of metal removal rates, and selectivity between copper, tantalum, and ILD, for example, is desirable for achieving planarity requirements.

The planarization of a rough surface of an article such as a semiconductor substrate, to a smooth surface generally involves rubbing the rough surface with the work surface of a pad using a controlled and repetitive motion. Thus, the process typically involves rotating the pad and semiconductor wafer substrate against each other in the presence of a fluid. The fluid may contain a particulate material such as alumina, ceria, or silica or mixtures thereof. The pad and particulate material tend to mechanically planarize the semiconductor substrate, while the fluid and particulate material tend to chemically planarize the substrate and to facilitate the removal and transport of abraded material off and away from the rough surface of the article. The particulate material has both a chemical and mechanical role in planarizing the article.

In order to maximize the density of integrated circuits per wafer, it is necessary to have an extremely planar substrate at various stages throughout the semiconductor wafer production process. As such, semiconductor wafer production processes typically involve at least one, and typically a plurality of CMP steps. One such semiconductor process is the damascene, or the related dual damascene, process for integrated circuits that use copper interconnects. Another example is the shallow trench isolation process. Another example is the production of tungsten via on a silicon wafer.

It is known in the art to use alumina and silica in the CMP process. U.S. Pat. No. 5,980,775 discloses a CMP composition that includes an oxidizing agent, at least one catalyst, at least one stabilizer and a metal oxide abrasive such as alumina or silica. Further, this patent discloses a method for using the CMP composition to polish at least one metal layer of a substrate. U.S. Pat. No. 6,136,711 discloses a CMP composition which includes a compound capable of etching tungsten, at least one inhibitor of tungsten etching, and a metal oxide abrasive such as alumina or silica. Further, this patent discloses a method for using the CMP composition to polish tungsten-containing substrates. U.S. Pat. No. 5,904,159 discloses a polishing slurry comprising a silica-dispersed solution obtained by dispersing fumed silica particles in an aqueous solvent, wherein the average primary particle size is from 5 to 30 nm, having a light scattering index of from 3 to 6 and a silica concentration of 1.5% by weight, and an average secondary particle size of from 30 to 100 nm on a weight basis.

Further, surface modification of silica is known in the art. According to the method of Kováts as described in Synthesis 1990, 1027, hydrated silica powder may be surface modified by heating with dialkylaminosilanes. U.S. Pat. Nos. 3,334,062; 4,143,027; 4,849,022; 5,008,305; and 5,902,635 also disclose methods of surface-modifying silica by mixing dried or partially hydrated silica with silanes. U.S. Pat. Nos. 1,110,331; 5,789,514; 5,9908,660 and 5,919,298 disclose methods of producing surface modified silica by aqueous phase condensation of reactive organic silanes. Moreover, the preparation of surface modified colloidal silica is disclosed in U.S. Pat. No. 2,786,042. U.S. Pat. Nos. 3,720,532; 4,068,024 and 4,443,357 disclose methods of surface modification of inorganic oxides by condensation with alcohol. Further, the modification of silica powder by gas phase condensation with organic silanes is disclosed in U.S. Pat. Nos. 4,015,031; 4,554,147; and 5,902,636. The modification of silica in a solvent phase by condensation with organic silanes is disclosed in U.S. Pat. Nos. 3,634,288; 3,768,537 and 5,647,962.

In general, the use of alumina abrasives has been considered desirable in the art because alumina particles have lower chemical reactivity than silica particles on silicon dioxide, and thus, alumina particles demonstrate a higher metal selectivity than silica particles. Without high selectivity, undesirable amounts of the silicon dioxide layer may be polished away with the metal. However, alumina slurries are generally more costly, and more prone to defects than silica slurries. Generally, alumina particles are more difficult to disperse than silica particles. Thus, it is desirable to develop a silica containing slurry that exhibits controlled removal rates and high selectivity relative to various metallic materials. "Selectivity" herein refers to the ratio of removal rates of two or more materials during CMP. For example, the selectivity of copper to tantalum represents the ratio of the removal rate of copper to the removal rate of tantalum.

Based on the prior art, one having ordinary skill in the art would expect metal removal rates for CMP to be described in accordance with the Preston Equation:

$$RR = KP + C$$

wherein RR represents removal rate, K is a constant referred to as the Preston Constant, P represents pressure at constant velocity, and C represents removal rate at zero pressure. As used herein, the term "Prestonian" refers to a relationship between removal rate and pressure that is described by the Preston Equation, i.e. removal rate increases monotonically with pressure at a constant velocity.

Modifications to the Preston Equation have been discussed in prior art references for the purpose of obtaining a better "fit" of data (cf Luo, Q.; Ramarajan, S. and Babu, S. V., *Thin Solid Films* 1998, 335, 160 and Ramarajan, S. and Babu, S. V., *Proc. MRS Spring Meeting*, San Francisco, Calif., April, 1999). However, these modified Preston Equations also describe Prestonian behavior.

The slurries of the prior art, which are described by the Preston Equation, result in undesirable amounts of dishing and erosion during the CMP process. Thus, it is also desirable to develop a slurry that minimizes dishing and eroding.

It has now been found that slurry compositions having the defined characteristics of the present invention provide performance advantages relative to metal removal rates and selectivity. Further, it has been found that a slurry composition of the present invention demonstrates performance that is not described by the Preston Equation, i.e., non-Prestonian behavior.

In accordance with the present invention, there is provided a slurry composition for CMP which comprises a surface-modified silica. The present invention also includes a method of preparing the slurry.

The features that characterize the present invention are pointed out with particularity in the claims that are part of this disclosure. These and other features of the invention, its operating advantages and the specific objects obtained by its use will be more fully understood from the following detailed description and the operating examples.

Other than in the operating examples, or where otherwise indicated, all numbers or expressions, such as those expressing structural dimensions, pressures, flow rates, etc, used in the specification and claims are to be understood as modified in all instances by the term "about".

DETAILED DESCRIPTION OF THE INVENTION

The slurry composition of the present invention includes a surface-modified silica. The silica for use in the slurry composition of the present invention may be prepared by methods known in the art such as the methods disclosed in U.S. Pat. Nos. 5,353,999; 5,739,197; 5,888,467; 5,911,963; and 6,086,669. In an embodiment, the silica may be a mono-dispersed colloidal silica, silica gel, fumed silica or precipitated silica. In an embodiment the silica is a precipitated silica. In general, the silica may be surface-modified by any method known in the art such as the methods disclosed in U.S. Patent Applications having the following Ser. Nos., 09/636,308; 09/636,309; 09/636,310; 09/636,311; 09/636,312; and 09/636,711, which are incorporated herein by reference; and other patents and publications as identified above.

As used herein and in the claims, the term "slurry" refers to a mixture of silica and a liquid, and the term "surface-modified silica" refers to a silica that is covalently bonded to a modifying moiety. The modifying moiety may include an organic group, an organometallic group, or combinations thereof. In an embodiment, the modifying moiety is an organosilane. In another embodiment, the surface of the silica is modified by the reaction of dimethyldichlorosilane with the silica.

In general, silica may be prepared by combining an aqueous solution of a soluble metal silicate with an acid. The soluble metal silicate is typically an alkali metal silicate such as sodium or potassium silicate. The acid may be selected from the group consisting of mineral acids, organic acids, and carbon dioxide. The silicate/acid slurry may then be aged. An acid or base is added to the silicate/acid slurry. The resultant silica particles are separated from the liquid portion of the mixture. The separated silica is washed with water, the wet silica product is dried, and then the dried silica is separated from residues of other reaction products, using conventional washing, drying and separating methods.

In an embodiment of the present invention, the surface-modified silica of the slurry composition may include primary particles. It is known in the art that when silicate polymerizes to a sufficient molecular weight such that the polymer size exceeds about one (1) nanometer, discrete silica particles form. These particles are referred to herein as "primary" particles. Methods for characterizing primary particles have been described in prior art references (e.g., "The Chemistry of Silica," Ralph K. Iler, 1979 John Wiley & Sons, New York, Chapter 5).

As used herein, the average diameter of the primary particles in the silica is calculated using CTAB specific surface area. The calculation includes dividing 2720 by the CTAB specific surface area in square meters per gram. This method is analogous to that described by the Iler reference (ibid page 465) for amorphous silica with a skeletal density of 2.2 grams per cubic centimeter. In an embodiment of the present invention, the primary particles have an average diameter of at least 7 nanometers, or at least 10 nanometers, or at least 15 nanometers.

In an embodiment, the primary particles may be approximately spherical.

Further, it is known in the art that primary particles having a size that is less than about 100 nanometers show a tendency to group together and form covalent siloxane bonds between the particles (e.g., "Iler"), in addition to the siloxane bonds within the primary particles. These groups of covalently-bonded primary particles are referred to herein as "aggregates". Methods for characterizing aggregates have also been described in the prior art (e.g., "Iler"). The aggregation of primary particles is minimized or eliminated in mono-dispersed colloidal silica by controlling the concentrations of silica and hydroxide in the preparation process.

The bonds between the aggregated primary particles in the silica are sufficiently weak such that the bond(s) may rupture when mechanical shear is applied using commercially available equipment such as a conventional homogenizer, Nanomiser(™), or Microfluidizer(™). In an embodiment, the bonds between the primary particles of the aggregates in the silica rupture to provide a slurry of the present invention wherein the aggregate size is five (5) microns or less, or one (1) micron or less, or one half (0.5) micron or less.

The size of the aggregates may be determined by methods that are known to the skilled artisan, e.g., using light scattering techniques, such as a Coulter LS particle size analyzer. As used herein and in the claims, "aggregate size" is defined as the diameter of the aggregate based on volume percent as determined by light scattering using a Coulter LS particle size analyzer. In this light scattering technique, the diameter is determined from a hydrodynamic radius of gyration regardless of the actual shape of the aggregate. The "average aggregate size" is the average diameter of the aggregate based on volume percent. In an embodiment, the average aggregate size is from 75 to 250 nm.

The silica used to prepare the slurry composition of the present invention, is such that the aggregates of primary particles are capable of "breaking down" into smaller aggregates of primary particles when subjected to a particle size reduction technique. The process conditions for manufacturing the silica are such that they favor the formation of aggregates which are prone to breaking down into smaller aggregates. It is believed that the aggregates which are prone to breaking down are due to silica aggregates with fewer siloxane bonds between the primary particles.

It is further believed that oil absorption is a measure f the openness of the silica structure and an indication of the susceptibility of the silica to undergo particle size reduction. In an embodiment, at least 50% of the aggregated primary particles are reduced to an aggregate size of less than one (1) micron. In an embodiment, at least 80%, and preferably 100% of the aggregated primary particles are reduced to an aggregate size of less than one (1) micron. As used herein and in the claims, dibutyl phthalate (DBP) oil absorption of the amorphous precipitated silica is determined according to ASTM D 2414-93 using dibutyl phthalate as the absorbate. The silica of the present invention typically has an oil absorption of at least 150 milliliters per 100 grams of silica. In an embodiment, the oil absorption is at least 220 milliliters per 100 grams of silica.

Oil absorption, however, cannot be solely relied on as an indicator of the susceptibility of silica to undergo particle size reduction. Inter-particle bridging in some cases may reinforce a silica aggregate and prevent the silica from breaking-down even though the oil absorption may be high. As an alternative, microscopy may be employed to give a physical measurement of the extent of material bridging between primary particles.

In an embodiment, the slurry of the present invention comprises surface-modified precipitated silica.

The silica to be surface modified for use in the slurry of the present invention has a "surface roughness" of at least 1.0 when defined by the ratio of the BET-nitrogen (5-point) surface area to CTAB specific surface area. As used herein, the term "BET surface area" is determined by the Brunauer, Emmett, and Teller (BET) method according to ASTM D1993-91. The term "surface roughness" as used herein and in the claims is defined in a manner analogous to the "roughness factor" that was described by Anderson and Emmett as the ratio of BET nitrogen surface area to the surface area determined electron micrographs (cf. R. B. Anderson and P. H. Emmett Journal of Applied Physics 1939, 19, 367). The surface area by electron micrograph is herein substituted by CTAB specific surface area.

The BET surface area was determined by fitting five relative-pressure points from a nitrogen sorption isotherm measurement that was made with a Micromeritics TriStar 3000™ instrument. A FlowPrep-060™ station provided heat and a continuous gas flow to prepare samples for analysis. Prior to nitrogen sorption, the silica samples were dried by heating to a temperature of 160° C. in flowing nitrogen (P5 grade) for a minimum of one (1) hour.

The CTAB specific surface area is a measure of the external surface area of the silica. The French Standard Method (French Standard NFT 45-007, Primary Materials for the Rubber Industry: Precipitated Hydrated Silica, Section 5.12, Method A, pp. 64–71, November 1987) measures the external specific surface area by determining the quantity of CTAB (CetylTrimethylAmmonium Bromide) before and after adsorption at a pH of from 9.0 to 9.5, using a solution of the anionic surfactant Aerosol OT as the titrant. Unlike other CTAB methods which use filtration to separate the silica, the French Standard Method uses centrifugation. The quantity of CTAB adsorbed for a given weight of silica and space occupied by the CTAB molecule are used to calculate the external specific surface area of the silica. The external specific surface area value is as square meters per gram. The detailed procedure used to determine CTAB is set forth in the Examples.

The surface area and surface roughness of a silica may depend on the method used to prepare the silica. In an embodiment, the silica used in the slurry of the present invention, was prepared by employing a precipitation process. In general, a lower temperature and higher hydroxide content during the precipitation step produces a silica having a high CTAB specific surface area. A higher temperature and a longer period of aging following the precipitation step, typically minimizes surface roughness.

In an embodiment, the surface roughness of the silica may be increased for a given primary particle size by changing precipitation conditions. For example, the hydroxide concentration may be increased during the "aging" step (Step I.e., for example, of the process described below) by adding a base such as a hydroxide to the mixture. The amount of hydroxide added may be such that the silica to hydroxide mole ratio is above 2.9. In an embodiment, the silica to hydroxide mole ratio is from 3.3 to 10; and in another embodiment, form 4.0 to 6.6. The hydroxide may be selected from a wide variety of known hydroxides, such as potassium hydroxide. The increased hydroxide concentration results in a significantly higher BET surface area, however, the CTAB specific surface area is unchanged or slightly decreased. This method may generally be used for increasing the surface roughness of a silica having low CTAB surface area. A "low" CTAB surface area is typically less than 100 $m^2/g$.

In another embodiment, the silicate and acid flow rates are balanced throughout the silicate and acid addition step (Steps I.c., for example, of the process as described below), to maintain a higher silicate to acid flow rate ratio. In this embodiment, the higher hydroxide concentration decreases the level of silicate neutralization during the addition step. This method may generally be used to increase the surface roughness of a silica having a high CTAB surface area. A "high" CTAB surface area is typically greater than 100 $m^2/g$.

Further, varying the duration of the aging step may also be used to modify the surface roughness of a silica when the reaction mixture has a pH of 8.5 or below (Step II.d., for example, of the process as described below). In this pH range, a longer aging period will result in a lower surface roughness.

A method of preparing the unmodified silica to be surface modified and used in the slurry of the present invention may include dissolving a solid-form of alkali metal silicate in water to produce an "additive, solution. Or, a concentrated solution of aqueous alkali metal silicate may be diluted to obtain the desired concentration of alkali metal ($M_2O$) in the "additive" solution. Herein, the weight amount of alkali metal is analytically reported as "$M_2O$". The alkali metal silicate may be selected from the group consisting of lithium silicate, sodium silicate, potassium silicate, and mixtures thereof.

The silica preparation processes as described herein, are carried out at a temperature which is sufficiently high to preclude gelation of the reaction mixture. Thus, the temperature is typically at least 70° C. Further, the temperature at which the preparation processes are carried out is sufficiently low to avoid boiling of the reaction mixture and the phase transition to crystallization when the process is conducted in a non-pressurized vessel. Thus, the temperature is typically not higher than 100° C. Moreover, the amount of $SiO_2$ and $M_2O$ used in the processes is selected relative to the gelation and crystallization concerns.

The resultant "additive" solution contains from 1 to 30 weight percent $SiO_2$ and has a $SiO_2$:$M_2O$ molar ratio of from 0.1 to 3.9. In an embodiment, the "additive" solution contains from 10 to 25 percent by weight $SiO_2$; and in another embodiment, 15 to 20 weight percent $SiO_2$. Further, the $SiO_2$:$M_2O$ molar ratio is from 2.9 to 3.5. Moreover, the $SiO_2$:$M_2O$ molar ratio is from 3.0 to 3.4; and in another embodiment, from 3.1 to 3.4.

A method of preparing an unmodified silica to be surface modified for use in a slurry of the present invention having a low CTAB specific surface area may include the following steps. As aforementioned, the term "low CTAB specific surface area" typically refers to a value of about 100 meters squared per gram or less.

(I.a.) A portion of "additive" aqueous alkali metal silicate solution is diluted with water to prepare an "initial" aqueous alkali metal silicate solution.

This "initial" solution contains from 0.1 to 2.0 weight percent $SiO_2$ and has a $SiO_2$:$M_2O$ molar ratio of from 0.1 to 3.9. The "initial" aqueous alkali metal silicate solution comprises from 0.2 to 1.5 weight percent $SiO_2$; or from 0.3 to 1.0 weight percent $SiO_2$. Further, the $SiO_2$:$M_2O$ molar ratio is from 1.6 to 3.9; or from 2.9 to 3.5 or from 3.1 to 3.4.

(I.b.) An acid is added to the "initial" aqueous alkali metal silicate solution to neutralize the $M_2O$ that is present, to form a first reaction mixture. In an embodiment, at least 90 percent of the $M_2O$ present in the initial aqueous alkali metal silicate solution is neutralized. As much as 100 percent of the $M_2O$ may be neutralized. In an embodiment, from 95 to 100 percent of the $M_2O$ is neutralized.

The percent neutralization may be calculated by assuming that one (1) equivalent of strong acid neutralizes one (1) equivalent of $M_2O$. For instance, 1 mole (2 equivalents) of sulfuric acid neutralizes 1 mole (2 equivalents) of $M_2O$. In an embodiment, the pH is adjusted to less than 9.5, or less than 9.0, or 8.5 or less. Suitable acids for use in this neutralization process step may vary widely. In general, the acid should be strong enough to neutralize the alkali metal silicate. Examples of such acids include sulfuric acid, hydrochloric acid, nitric acid, phosphoric acid, formic acid, acetic acid, and mixtures thereof. In an embodiment, sulfuric acid, hydrochloric acid, nitric acid or phosphoric acid is used. In another embodiment, sulfuric acid is used.

(I.c.) Another portion of the "additive" aqueous alkali metal silicate solution and acid are added, preferably simultaneously, to the first reaction mixture over a period of time to form a second reaction mixture. In an embodiment, the addition is completed in a period of from 20 to 180 minutes; or from 30 to 120 minutes; or from 45 to 90 minutes. The amount of "additive" solution used is such that the amount of $SiO_2$ added is from 0.5 to 30 times the amount of $SiO_2$ present in the "initial" aqueous alkali metal silicate solution. In an embodiment, from 3 to 28 times the $SiO_2$ present in the "initial" solution is added. In another embodiment, the amount of acid which is added is such that at least 90 percent of the $M_2O$ contained in the "additive" solution added during the simultaneous addition is neutralized. In an embodiment, at least 95 percent of the $M_2O$ is neutralized; and in another embodiment, 100 percent of the M2O is neutralized. In an embodiment the pH is maintained at less than 9.5, or less than 9.0, or 8.5 or less.

Suitable acids for use in this second neutralization process step may vary widely. As aforementioned, the acid should be strong enough to neutralize the alkali metal silicate. Examples of such acids include sulfuric acid, hydrochloric acid, nitric acid, phosphoric acid, formic acid, acetic acid, and mixtures thereof. In an embodiment, sulfuric acid, hydrochloric acid, nitric acid or phosphoric acid is used. In another embodiment, sulfuric acid is used.

(I.d.1.) If an unmodified silica to be surface modified for use in a slurry of the present invention having a low surface roughness is desired, acid is added to the second mixture with agitation to form a third reaction mixture. As used herein, "low" surface roughness" refers to a silica having a BET surface area to CTAB specific surface area ratio of less than 1.2. The amount of acid used is such that the pH of the third reaction mixture is 9.3 or lower. In an embodiment, the pH is from 7.0 to 9.3; and in another embodiment, from 7.5 to 9.0. A wide variety of acids may be used in this step. The acid selected should be strong enough to reduce the pH to a value within said pH ranges. Suitable acids include sulfuric acid, hydrochloric acid, nitric acid, phosphoric acid, formic acid, and acetic acid. In an embodiment, sulfuric acid, hydrochloric acid, nitric acid or phosphoric acid may be used.

(I.d2) If an unmodified silica to be surface modified to be used in a slurry of the present invention having a high surface roughness is desired, hydroxide may be added to the second reaction mixture with agitation to form a third reaction mixture. As used herein, "high" surface roughness refers to a silica having a BET surface area to CTAB specific surface area ratio of 1.2 or higher. The amount of hydroxide which is added is such that the silica to hydroxide mole ratio is above 2.9. In an embodiment, the silica to hydroxide mole ratio is from 3.3 to 10; and in another embodiment, from 4.0 to 6.6. The hydroxide used in this step may vary widely. Examples of suitable hydroxides include ammonium hydroxide, potassium hydroxide, sodium hydroxide, organic ammonium hydroxides, hydroxides of organic amines, and mixtures thereof. In an embodiment, potassium hydroxide is used.

(I.e.) Either of the third reaction mixtures (for low or high surface roughness) may be aged with agitation. In an embodiment, the period of aging is from 10 to 100 minutes; and in another embodiment, from 20 to 90 minutes.

(I.f.) Acid is then added to the third reaction mixture while agitating to form a fourth reaction mixture. The amount of acid that is added is such that the pH of the fourth reaction mixture is less than 7.0. In an embodiment, the pH is from 3.0 to 6.0; and in another embodiment, from 3.5 to 4.5. The acid used in this step may vary widely. As stated previously, the acid used should be strong enough to reduce the pH of the mixture to within the specified ranges. Examples of such acids include sulfuric acid, hydrochloric acid, nitric acid, phosphoric acid, formic acid, and acetic acid. In an embodiment, sulfuric acid, hydrochloric acid, nitric acid, and phosphoric acid are used.

In an embodiment, an unmodified silica having a high CTAB specific surface area, to be surface modified for use in a slurry of the present invention, may be prepared according to the following process.

(II.a) A portion of the "additive" aqueous alkali metal silicate solution may be diluted with water to produce an "initial" aqueous alkali metal silicate solution containing from 0.1 to 5.0 weight percent $SiO_2$ and having hydroxide content of from 0.02 mol per liter to 0.35 mol per liter. Additional hydroxide may be added to this initial aqueous alkali metal silicate solution to adjust the hydroxide content to from 0.02 mol per liter to 0.35 mol per liter. In an embodiment, the initial aqueous alkali metal silicate solution comprises from 0.2 to 4.0 weight percent $SiO_2$; and in another embodiment from 0.3 to 3.0 weight percent $SiO_2$.

Further, in an embodiment, the hydroxide content is from 0.02 mol per liter to 0.26 mol per liter; and in another embodiment, from 0.03 mol per liter to 0.22 mol per liter.

The hydroxide content, in mol per liter, of a reaction mixture may be determined by titrating a sample of the reaction mixture diluted with approximately 100 milliliters of deionized water using 0.645 N hydrochloric acid in the presence of phenolphthalein indicator. The hydroxide content, in mol per liter, is then calculated by taking the milliliters of 0.645 N HCl used in the above titration, multiplying by the normality of the titrant, and dividing by the volume, in milliliters, of the reaction mixture.

(II.b.) Over a period of time, with agitation, additive aqueous alkali metal silicate solution and acid are added, preferably simultaneously, to the first reaction mixture thereby forming a second reaction mixture wherein the amount of additive aqueous alkali metal silicate solution is such that the amount of $SiO_2$ added is from 0.5 to 30 times the amount of $SiO_2$ present in the initial aqueous alkali metal silicate solution established in step (II.a). The amount of acid is such that the hydroxide content established in step (II.a) is maintained. In an embodiment, the amount of $SiO_2$ added is from 3 to 28 times the amount of $SiO_2$ present in the initial aqueous alkali metal silicate solution established in step (II.a). This addition may be made over a period of 20 to 180 minutes. Alternatively this addition may be made over a period of 30 to 120 minutes. In an embodiment the addition may be made over a period of 45 to 90 minutes.

(II.c.) Acid is added to the second mixture with agitation to form a third reaction mixture. The amount of acid used is such that the pH of the third reaction mixture is 9.3 or lower. In an embodiment, the pH is from 7.0 to 9.3; and in another embodiment, from 7.5 to 9.0. A wide variety of acids may be used in this step. The acid selected should be strong enough to reduce the pH to a value within the aforementioned specified ranges. Suitable acids include sulfuric acid, hydrochloric acid, nitric acid, phosphoric acid, formic acid, and acetic acid. In an embodiment sulfuric acid, hydrochloric acid, nitric acid or phosphoric acid is used.

(II.d.) The third reaction mixture may be aged with agitation for a period of time. In an embodiment, the period of aging is from 10 to 120 minutes; and in a further embodiment, from 20 to 90 minutes.

(II.d.1.) In an embodiment, a silica having a low surface roughness is produced by aging for longer than 30 minutes. In another embodiment the aging step is longer then 60 minutes. As aforementioned, "low" surface roughness as used herein refers to a silica having a BET surface area to CTAB specific surface area ratio of less than 1.2.

(II.d.2.) In an embodiment, a silica having a low surface roughness may be produced by aging the third reaction mixture for a time period of 120 minutes or less. In another embodiment, the aging step is carried out for a period of 30 minutes or longer. As aforementioned, "high" surface roughness as used herein refers to a silica having a BET surface area to CTAB specific surface area ratio of 1.2 or higher.

(II.e.) Acid is then added to the third reaction mixture while agitating to form a fourth reaction mixture. The amount of acid added is such that the pH of the fourth reaction mixture is below 7.0. In an embodiment, the pH is from 3.0 to 6.0; and in another embodiment, from 3.5 to 4.5. The acid used in this step may vary widely. As stated previously, the acid used should be strong enough to reduce the pH of the mixture to within the specified ranges. Examples of such acids include sulfuric acid, hydrochloric acid, nitric acid, phosphoric acid, formic acid, and acetic acid. In an embodiment, sulfuric acid, hydrochloric acid, nitric acid, and phosphoric acid are used.

The process for preparing a silica having a high CTAB specific surface area and the process for preparing a silica having a low CTAB specific surface area, as discussed above, may further include the following steps.

(III.a.) The silica produced in the fourth reaction mixture is separated from most of the liquid of the aged fourth reaction mixture. This separation may be accomplished by one or core techniques known in the art for separating solids from liquid; such as, for example, filtration, centrifugation, decantation, and the like.

(III.b.) The separated silica is then washed using any of the known procedures for washing solids, such as, for example, passing water through a filter cake, and reslurrying the silica in water followed by separating the solids from the liquid. One washing cycle or a succession of washing cycles may be employed as desired. A purpose of washing the silica is to remove salt formed by the various neutralizations to desirably low levels. The silica is typically washed until the concentration of salt in the dried silica is less than or equal to two (2) weight percent. In an embodiment, the silica is washed until the concentration of salt is less than or equal to one (1) weight percent.

(III.c.) The washed silica is then dried using one or more techniques known to a skilled artisan. For example, the silica may be dried in an air oven or in a vacuum oven. In an embodiment, the silica is dispersed in water and spray dried in a column of hot air. The temperature at which drying is accomplished is not critical. In an embodiment, the drying temperature is below the fusion temperature; thus, the drying temperature is typically less than 700° C. The drying process may be continued until the silica has the characteristics of a powder.

In general, the dried silica is not completely anhydrous but contains "bound" water (e.g., from 1 to 5 weight percent) and moisture which is not bound water (e.g., from 1 to 15 weight percent) in varying amounts. The latter may be dependent upon the prevailing relative humidity and by loss in the weight of the sample from vacuum drying. "Bound" water is defined herein as that water which is removed by additional heating of the silica at calcination temperatures, for example, from 1000° C. to 1200° C. In the present invention, the bound water value is used to calculate the number of hydroxyl groups per gram of moisture-free silica. In this calculation, it is assumed that there are two surface hydroxyls for each mole of bound water. The number of hydroxyl groups per nm2 is calculated according to the following equation:

$$\text{Hydroxyls per nm}^2 = 2*10^{-18}*N*\text{bound water}*(CTAB \text{ specific surface area})^{-1}$$

Wherein the bound water is given as moles per gram of silica, the CTAB specific surface area is given as meters squared per gram of silica, and N is Avogadro's number ($6.023 \times 10^{23}$ hydroxyls per mole).

The surface of unmodified silica generally contains hydroxyl groups from siloxane-chain terminating silanols. The number of hydroxyl groups per unit of surface area of silica will vary according to the preparation method. Pyrogenic processes tend to produce silica with low hydroxyl-group content, typically less than seven (7) hydroxyl groups per nanometer squared of surface area. Hydrothermal processes, like those used in mono-dispersed colloidal silica or precipitated silica, tend to produce higher hydroxyl-group content silica, typically seven (7) or greater hydroxyls per nanometer squared of surface area.

The role of hydroxyl groups in material removal during the CMP process using a silica-based slurry has been suggested. For example, it has been suggested that hydroxyl groups of the silica in the slurry bond with hydroxyl groups in the silicon dioxide ILD, and chemically facilitate ILD removal (see L. M. Cook, in *Journal of Non-Crystalline Solids* 1990, 120, 152–171). The affect of hydroxyl groups on copper and tantalum removal rates in CMP with slurries that contain fumed silica has also been suggested (see Li, Y. and Babu, S. V. "Chemical Mechanisms in CMP of Cu and Ta using Silica Abrasives", *Fifth Annual CMP Symposium* 2000 Aug. 14, 2000, Lake Placid, N.Y., and Li, Y.; Jindal, A. and Babu, S. V., Role of Chemicals and Abrasive Particle Properties in Chemical-Mechanical Polishing of Copper and Tantalum, *Proc. The Electrochemical Society* 198th Meeting, Phoenix, Ariz., Oct. 22–27, 2000).

In an embodiment, the number of hydroxyl groups per $nm^2$ is at least 7, or at least 10, or at least 15. As indicated above, these parameters are typically representative of silica prepared by a precipitation process.

The determination of weight percent moisture involves a method for measuring the loss in weight of the sample resulting from vacuum drying at approximately 105° C. A procedure is described in ASTM Standards, Method A of D-280, Volume 06.02. A silica sample is dried at 105±3° C. in a weighing bottle at atmospheric pressure. After approximately 30 minutes, vacuum is engaged and the sample is dried in vacuo for an additional 30 minutes. Weight loss from the original sample is considered moisture loss, and is used to determine weight percent moisture.

The bound water per gram of silica is determined as follows. The total weight loss per gram of silica is measured by gravimetric ignition after heating the silica from room temperature to 1150° C. for one (1) hour. The moisture loss (as described above) is subtracted from the total weight loss. Further, the weight losses per gram of chlorine and sulfur trioxide that occur during ignition are also subtracted from the total weight loss. Chlorine and sulfur trioxide content are calculated from the amount of chloride salt and sulfate salt content in the silica, respectively. The concentrations of chloride and sulfate salts used in this calculation are determined by x-ray fluorescence measurements on the silica. Thus, the bound water per gram of silica is calculated by the formula:

Bound water per gram of silica=weight lost per gram at 1150° C.–moisture per gram at 105° C.–chlorine loss per gram at 1150° C.–sulfur trioxide loss per gram at 1150° C.

In general, for the silica preparation processes described above, the degree of agitation used in the various steps may vary considerably. The agitation employed during the addition of one or more reactants should be at least sufficient to provide a thorough dispersion of the reactants and reaction mixture so as to avoid more than trivial locally high concentrations of reactants and to ensure that silica deposition occurs substantially uniformly. The agitation employed during aging should be at least sufficient to avoid settling of solids to ensure that silica deposition occurs substantially uniformly throughout the mass of silica particles rather than on those particles at or near the top of a settled layer of particles.

As previously mentioned, the silica used to prepare the slurry of the present invention is such that the aggregated primary particles are capable of "breaking down" into smaller aggregates of primary particles when subjected to a particle size reduction technique. The surface of the silica may be surface modified prior to or after "breaking down" the aggregates of the primary particles. The resultant smaller aggregates may be have an aggregate size of less than five (5) microns, or less than one (1) micron, or less than 0.5 micron. Thus, the slurry of the present invention may comprise silica having an aggregate size of less than five (5) microns, or less than one (1) micron, or less than 0.5 micron.

Particle size reduction techniques are known in the art and may be exemplified by grinding and pulverizing. In an embodiment, a wet milling process such as a fluid energy milling process may be used for reducing the size of the aggregated primary particles. This milling process includes the use of air or superheated steam as the working fluid. Fluid energy mills have been described in the prior art (e.g., Perry's Chemical Engineers Handbook, 4th Edition, McGraw-Hill Book Company, New York, (1963), Library of Congress Catalog Card Number 6113168, pages 8–42 and 8–43; McCabe and Smith, Unit Operations of Chemical Engineering, 3rd Edition, McGraw-Hill Book Company, New York (1976), ISBN 0-07-044825-6, pages 844 and 845; F. E Albus, "The Modern Fluid Energy Mill", Chemical Engineering Progress, Volume 60, No. 6 (June 1964), pages 102–106, the entire disclosures of which are incorporated herein by reference).

In the fluid energy milling process, the aggregated primary particles of the silica are suspended in a gas stream and circulated at a high velocity in a circular or elliptical path, within a confined chamber. Some reduction of the aggregate size occurs when the particles strike or rub against the walls of the confining chamber, but most of the reduction is believed to be caused by inter-particle attrition.

In another embodiment, silica is dispersed by directly contacting the silica with a high-pressure water jet. The resulting aqueous-slurry stream is then carried into a cavitation chamber, which contains an alternating series of narrow-bore and wide-bore cells. A second high-pressure water jet is directed into the cavitation chamber in an opposing flow direction to enhance silica-particle impingement within the cells.

In another embodiment, the silica for use in the slurry of the present invention is prepared by reducing the aggregate size of the silica using a double-jet cell process that is related to the apparatus and method disclosed in WO00/39056 and U.S. Pat. No. 5,720,551. The process as disclosed in these references uses a double jet cell to produce emulsions by reducing droplet size in a water-oil mixture.

In an embodiment of the present invention a double-jet cell process is useful for producing a silica for use in a slurry for CMP of semiconductors since it is desirable for the aggregates in the silica to have an aggregate size of less than one (1) micron to prevent wafer scratching. In an embodiment, the double-jet cell process includes an apparatus containing two nozzles; each nozzle delivers a jet of fluid along a path. The nozzles are oriented essentially opposite one another. Thus, a first jet of fluid is directed toward a second jet of fluid, and the two jets of fluid interact in a region in an elongated chamber. The nozzles may be ceramic such as alumina, sapphire, or diamond coated such that wear from the fluid jet is reduced. In an embodiment, said fluid comprises water. The elongated chamber is configured to form a stream of fluid from the two jets that follows a path that has essentially the opposite direction from one of the paths of one of the jets. To reduce particle size, the chamber includes one or more reactors, which may have different characteristics (e.g., inner diameter, contour, and composition). In an embodiment, twelve (12) or less reactors are used, or four (4) to eight (8) reactors. Seals are positioned between the reactors. The seals may have different seal characteristics (e.g., inner diameter). The ratio of internal diameter of the seals to that of the reactors is greater than one (1), or greater than two (2).

The two jets of fluid are ejected from two nozzle orifices having different diameters. The velocity of one jet of fluid is dominate and the velocity of the other jet of fluid is recessive. The ratio of the two jet velocities will affect the mean residence time of any given particle in the elongated chamber. The closer the recessive (or lower) jet velocity is to the velocity of the dominant (or higher) jet, the more flow reversal will occur. This backflow will increase particle impingement, and thereby enhance particle size reduction of the aggregate in the silica. The internal diameter of a reactor in the elongated chamber may be used to approximate the nozzle size of the recessive jet. The ratio of the orifice diameters of the two nozzles may be greater than 1:1, but less than 2:1. In an embodiment, the ratio is 1.05:1 to 1.3:1.

The double-jet cell apparatus also includes an outlet port which is configured near the nozzle which discharges the lower velocity jet. The outlet port emits a stream of fluid from the elongated chamber. An inlet port is included in the region of the elongated chamber wherein the nozzle which discharges the high velocity jet is positioned. The inlet port may be used to receive a third fluid, and discharges the third fluid toward the nozzle discharge of the higher jet velocity. In an embodiment of the present invention, the third fluid comprises silica. In another embodiment, the silica is precipitated silica, or a spray dried silica. In other embodiments, the third fluid may further comprise a gas such as air, or a liquid such as water. A pressure drop across the nozzle produces a vacuum at this inlet port.

The silica may be fed into the inlet port from a mechanical feeder such as a screw feeder. Or, the silica may be added into the inlet port by drawing the silica through a feed tube into the inlet port by vacuum. Fluid pressure into the two nozzles must be such that the jets obtain a sufficient velocity to reduce the aggregate size of the silica. Generally, sufficient particle-size reduction uses pressures exceeding 30,000 psig, or in excess of 40,000 psig, for jets produced from nozzles with orifices in the range of 0.1 to 0.15 millimeters.

The jets of fluid may contain chemicals, such as polyacrylamide copolymers, that are known to reduce nozzle wear and reduce energy consumption in water-jet technology. The jets of fluid may contain other chemicals, such as surfactants and thickeners, to prevent particle flocculation. Other soluble formulation components may be added to the jets of fluid rather than being added to the product slurry after particle size reduction of the silica.

In another embodiment, the silica may be dispersed without drying by passing the liquefied product through a high-pressure homogenizer to reduce the aggregate size. Multiple passes through the homogenizer may be necessary to optimize the aggregate size. A pre-dispersion of silica in fluid may also be subjected to particle size reduction through a homogenizer. In an embodiment of the present invention, a blend of silicas may be used in the slurry. A blend may include a mixture of at least one surface modified silica with at least one unmodified silica. The slurry may also include at least one silica having one type of surface modification and at least one silica having a different type of surface modification. Each silica may possess different physical properties, for example surface area, surface roughness, shape, porosity, morphology; and different chemical properties, for example hydroxyl content, surface modification(s), ion content, and minor inorganic components. A blend may further include more than one surface-modified silica wherein each silica has a different average particle size diameter.

In an embodiment, a slurry for use in a CMP process may be formulated by adding a sodium-free acid to the slurry in an amount such that the pH of the mixture is greater than 2. Suitable acids include mineral acids, such as sulfuric acid and hydrochloric acid; or organic acids, such as carboxylic acids, diacids, or polyacids, and mixtures thereof. Various buffers known in the art may be added to the mixture to mitigate pH fluctuations during the CMP process. Other formulation components may also be added to the slurry to optimize performance for a specific CMP application, such as for removal of specific metals. Formulation components may include corrosion inhibitors, static etch controllers, accelerators, metal halides such as fluorides, surfactants, metal chelating or complexing agents, and oxidants.

The slurry composition of the present invention includes a silica wherein the surface has been chemically modified. This surface-modified silica contains chemical moieties other than, and in addition to hydroxyl groups. These chemical moieties alter the chemical-mechanical interaction between the silica and the substrate surface compared to interactions that occur with unmodified silica, i.e, having only surface hydroxyl groups. The breadth of these interactions that occur with a slurry containing surface-modified silica, improves the slurry performance in a CMP process.

The behavior of a slurry containing unmodified silica relative to removal rates and selectivity, is described in accordance with the Preston Equation. Thus, for a slurry containing unmodified silica, the material removal rate increases monotonically with pressure at constant velocity. A slurry containing surface-modified silica according to the present invention exhibits non-Prestonian behavior. Thus, for a surface-modified silica containing slurry, the material removal rate does not behave monotonically in accordance with the Preston Equation. At low pressure, the removal rate of the surface-modified silica-based slurry can be distinguished from that of the unmodified silica-based slurry. At high pressure, for a surface-modified silica-based slurry as used in the present invention, the material removal rate is not the expected Prestonian behavior over a useful pressure range. As pressure initially increases from low pressure, the removal rate initially increases monotonically, or not at all. However at some increased pressure, the removal rate of the surface-modified silica-based slurry sharply increases and approaches, and may equal, that of the unmodified silica-based slurry.

An unmodified silica may be treated with one or more materials that covalently bond to the silica creating a surface-modified silica. The surface-modified silica is then used to prepare a slurry. Further, a slurry comprising an unmodified silica may be treated with a modifying moiety to produce a surface-modified silica containing slurry. A wide variety of materials may be used to surface modify the silica. Typically, such materials include organic or organometallic reactive molecules, or mixtures thereof, suitable for reacting with the surface of the silica. Examples of suitable materials include silanes, for example alkoxysilanes, aminosilanes, chlorosilanes, or alcohols, and the like. The unmodified silica may be surface-modified either before or after the aggregate size is reduced. In an embodiment, the aggregate size is reduced after the silica surface is modified.

Figure 1:
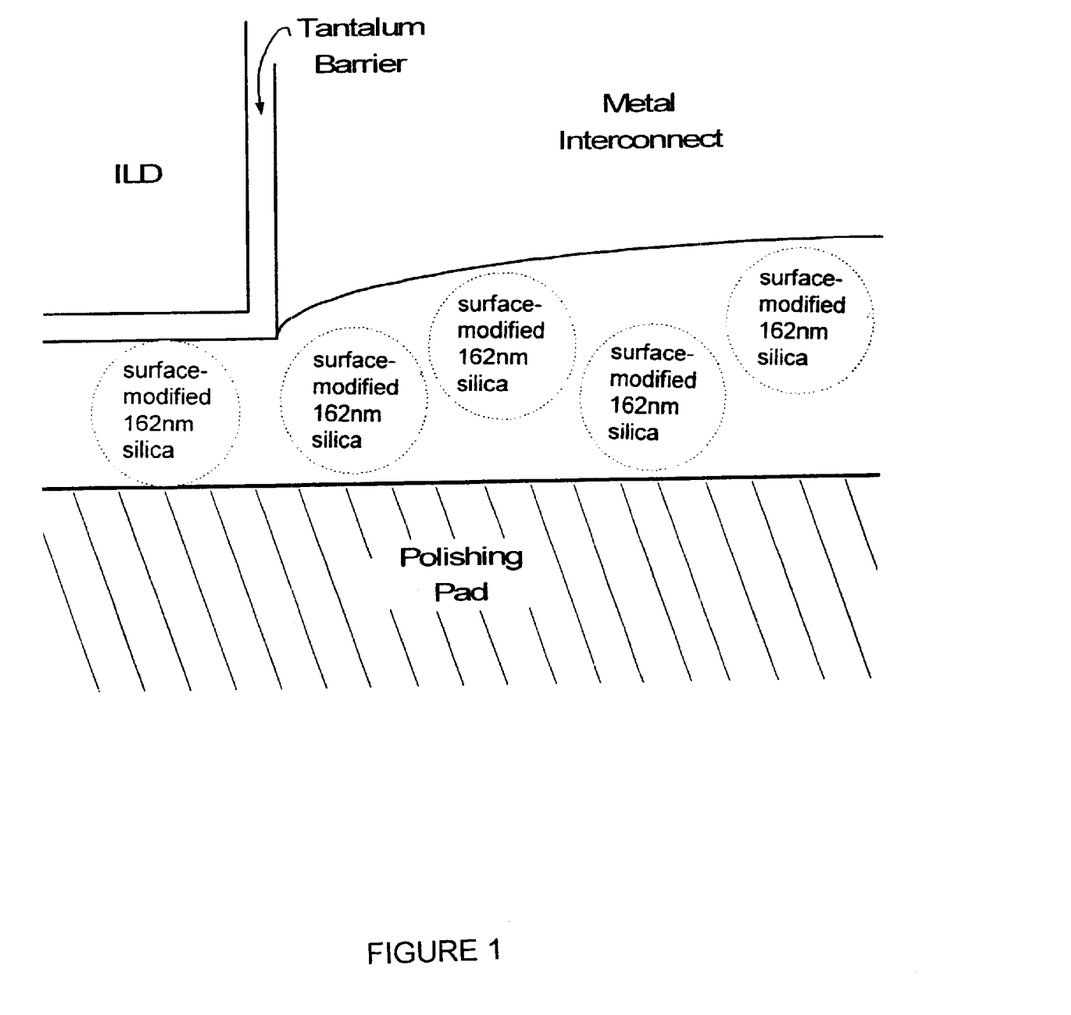
FIG. 1 provides an illustration depicting a CMP process for barrier removal with surface-modified silica.

FIG. 1 shows the removal of a tantalum barrier from a substrate during a CMP process using a surface-modified silica. In FIG. 1, the localized pressure at the barrier-silica-pad interface exceeds the pressure at the metal-silica-pad interface of a dished interconnect. In the low-pressure region, the metal interconnect interacts primarily with the modified surface of the silica. In the high-pressure region, barrier interacts with modified-surface and core of the silica. (Scale as shown: a 30 nm thick barrier, the edge a 20 μm metal interconnect with a 250 nm dish, 160 nm diameter silica particles with 1 nm thick surface modification.)

In an embodiment, the surface of an unmodified silica is modified by a chemical moiety. The chemical moiety includes a group that modifies the material removal rate from a substrate surface during the CMP process. The group is referred to herein by the term "removal rate modifying group". The removal rate modifying group is covalently bonded to the surface of the unmodified silica. As used herein and in the claims, "removal rate" refers to the amount of material, such as metal or ILD, that is removed from a substrate, such as a wafer, per unit of time, during a CMP process. Since CMP is primarily a flattening process, "removal rate" has been characterized as a height reduction, or thinning, of the surface of a substrate per unit of time, for example nanometers per minute or angstroms per minute. In an embodiment, the removal rate modifying group is a carbon-containing organic or oganometallic moiety and the surface-modified silica is an organic-inorganic hybrid material.

The surface-modified silica may contain hydroxyl groups from siloxane chains in the silica in addition to the removal rate modifying group. In an embodiment, more than one type of removal rate modifying group may be used to modify the silica surface.

Removal rates and selectivity are dependent upon the chemical and mechanical properties of the surface-modified silica in the slurry of the present invention. Removal rates will vary with the type of removal rate modifying group(s) used, the amount of surface covered by the group(s), the number of remaining hydroxyl groups, and the properties of the silica core. Further, since the removal rate results from an interaction between the silica in the slurry and the substrate surface, removal rates are also dependent upon the chemical and mechanical properties of the material that is being removed from the substrate surface. These substrate surface materials include silicon, aluminum, silicon oxide, tungsten, titanium, titanium nitride, copper, tantalum, tantalum nitride.

The slurry of the present invention may also be used to planarize dielectric materials, such as interlayer dielectrics (ILD) used in microelectronic devices, such as metal oxide semiconductors (MOS), complementary-MOS (CMOS), dynamic random access memory (DRAM), among others. Process methods for manufacturing these devices include damascene, dual damascene, and shallow trench isolation. These ILD may be silicon dioxide, or metal-doped silicon dioxide such as with boron or phosphorus in borophosphate silica glass (BPSG). These silicon dioxide type ILD may be produced by chemical vapor deposition (CVD), or plasma-enhanced CVD, high density Plasma CVD, or thermal oxidation, among others. Other ILD materials include spin-on glasses (SOG) or polymeric materials such as polyimides. These other ILD materials include silicon based materials such as Black Diamond(™), fluorine-doped silicate, xerogels, or silisesquioxanes such as hydrogen silisesquioxanes and organo silisesquioxanes. Carbon-based ILD include for example paralyene, SILK(™), amorphous carbon or fluorocarbon, diamond-like carbon or fluorocarbon, or mixtures thereof.

Further, the removal rate may vary with the physical properties of the polishing pad. In general, harder pads have a tendency to produce lower removal rates. This may be due to a smaller amount of the silica in the slurry becoming imbedded into the pad during the CMP process. Softer pads generally produce more dishing and erosion. It is believed that the dishing and erosion may be the result of the pad deforming, causing recesses in the surface of the substrate, and the removal rates in these recesses being increased.

Selected removal rate modifying groups may retard material removal rates due to the strong adhesion of the surface-modified silica with the surface of the substrate. An example of a removal rate modifying group that may inhibit metal removal from the substrate surface includes dimethylsilanols. Other removal rate modifying groups may retard material removal rates due to the weak adhesion or no adhesion of the surface-modified silica particle with the surface of the substrate material. Further, removal rate modifying groups may increase metal removal rates relative to unmodified silica. The chain length, conformational rigidity, steric bulk, and regiochemical orientation of the group may impact the removal rate.

Removal rate modifying groups may be chemically inert in the CMP process relative to the unmodified silica surface, and may be selected to optimize the spatial relationships between the silica-core, the removal rate modifying group (s), and the substrate. In an embodiment, the removal rate modifying group(s) includes for example, alkyl or aryl hydrocarbon radicals such as methyl, ethyl, propyl, and phenyl. Further, removal rate modifying groups may have chemical reactivity and embody functional groups other than hydrocarbons, such as hydroxyl containing hydrocarbons, amine containing hydrocarbons, acid containing hydrocarbons, ester containing hydrocarbons, heterocycle containing hydrocarbons, organosilyl groups, organosilanol groups, or polyorganosiloxanes.

Suitable removal rate modifying groups include omega-substituted-1-dialkylsilylalkyleno groups such as 3-substituted-1-dimethylsilyl propyleno groups, aryl substituted.dialkylsilyl phenyl groups such as 4-substituted-dimethylsilylbenzene, or organopolysiloxanes. In these examples, the group(s) covalently anchors to the silica surface via an organosilyl-oxygen bond. In an embodiment, the group(s) may be a disubstituted alkyl or aryl group that is anchored covalently to the silica surface by a carbon-oxygen bond. The removal rate modifying group(s) may be hydrolytic instable if not selected in accordance with the conditions during CMP, such as temperature and pH. The group(s) that is anchored to a silica surface by a carbon-oxygen bond is typically more hydrolytically vulnerable to cleavage back to an unmodified surface than that which is anchored by a silicon-oxygen bond.

Figure 2:
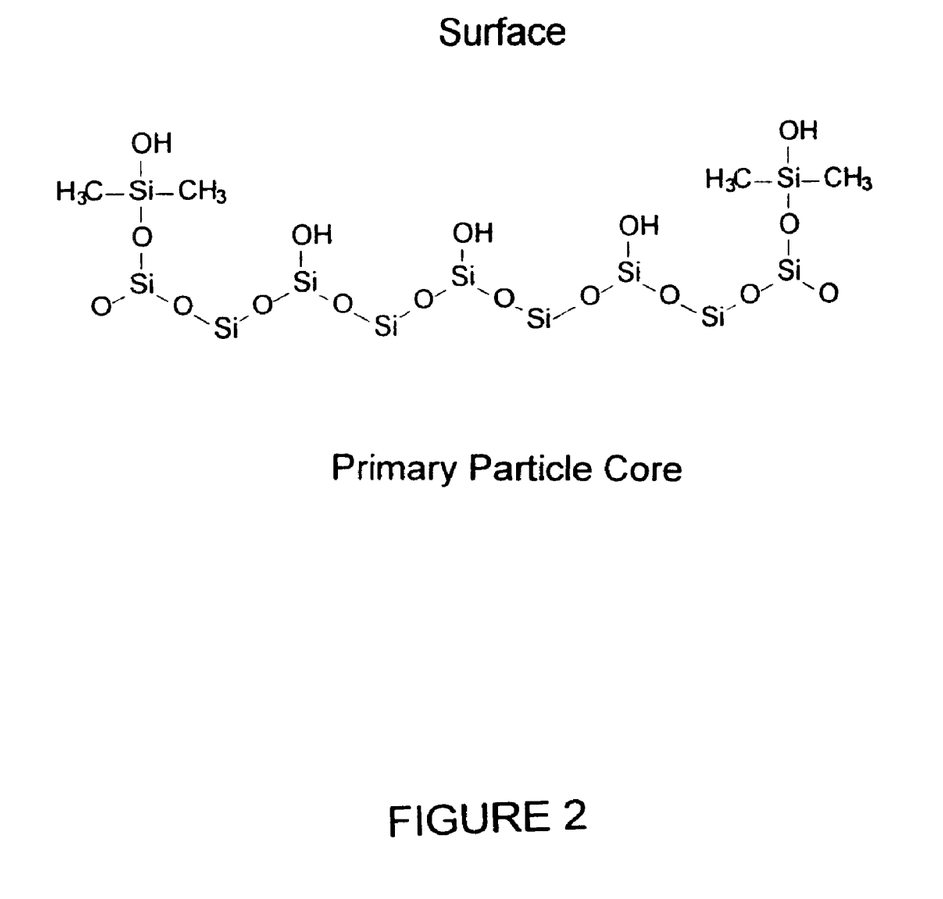
FIG. 2 provides an illustration depicting partial modification of the surface of the silica abrasive particle by treating silica silanols with dimethylsilanol groups.

FIG. 2 shows the surface modification of an unmodified silica, for use in a slurry of the present invention.

In FIG. 2, the removal rate modifying group is a dimethylsilanol group that is covalently bonded to the silica core. Although shown as individual dimethylsilanols, the structure may contain dimethylsiloxane chains of varying length, and these chains may be crosslinked or dimethylsilanol terminated.

In an embodiment of the present invention, the slurry contains dimethylsilanol surface-modified silica. The performance exhibited by this slurry during CMP of copper is in accordance with the Preston Equation (i.e., Prestonian performance). Thus, the copper removal rate increases with increasing pressure in a manner that may be described as a linear relationship at constant velocity. However, the performance exhibited by the dimethylsilanol surface-modified silica based slurry during CMP of tantalum is not in accordance with the Preston Equation (i.e., non-Prestonian performance).

It is believed that the presence of the dimethylsilanol group(s) reduces the interaction between the tantalum layer on the substrate and the surface-modified silica in low-pressure regions. This effect may be due to mechanical and chemical interactions. As such, tantalum removal rates may be minimized in low-pressure regions, such as dished or eroded areas. In a high pressure region, the interaction may be significantly increased as compared to the low pressure region. Consequently, tantalum removal rates at sufficiently high pressure may be significantly higher than in the low pressure region.

Further, it is believed that when pressure is sufficiently high, interaction between the silica and the tantalum surface increases, and the removal rate increases with sharper slope. This increased interaction may be due to the exposure of surface silanols, or an increased number of surface silanols that are present in surface-modified silica, or change in effective modulus of the surface-modified silica particle as the harder silica core becomes engaged at higher pressure. It is believed that an increase in removal rate also enhances the tantalum removal rate in a protruded area of the substrate, where the pressure between the pad and substrate is higher. These factors contribute to producing better surface uniformity, lower dishing and a longer planarity distance on a substrate surface.

The surface-modified silica for use in the slurry of the present invention may be prepared from silica that is capable of being reduced by shear to an aggregate size of less than 5 microns, or less than 1 micron, or less than 0.5 micron, such as precipitated silica, fumed silica, silica gel, and mixtures thereof. Further, the surface modified silica that is used in the slurry of the present invention may be prepared from sources of silica that are synthesized to an aggregate size of less than 5 microns, or less than 1 micron, or less than 0.5 micron without the need for particle-reducing shear, such as mono-dispersed colloidal silica and aggregated colloidal silica. Surface-modified metal oxides other than silica, such as alumina, may also be used in the slurry of present invention.

In an embodiment, a moiety suitable to modify the surface of a silica may be an organic silane as described by the following formula:

$$R^1{}_m H_b SiX_{4-m-b}$$

Wherein $R^1$ each represents an organic radical that may contain one or more functional groups, and m represents an integer from 1 to 3. Hydrogen atoms may be attached to silicon; b represents an integer of 2 or less. X represents a hydrolyzable group bonded to silicon such as halide, acetate or other carboxylate, methoxyl or other alkoxyl group, and (4−m−b) represents an integer from 1 to 3. For this formula, the sum of m and b represents an integer of at least 1 and less than 4.

In another embodiment, an organic siloxane of the following formula may be used to modify the silica surface:

$$(R^2{}_3Si)_2O$$

Wherein $R^2$ each represents an organic radical that may contain one or more functional groups.

In a further embodiment, cyclic and oligomeric siloxanes of the following formula may be used to modify the silica surface:

$$T-O-(R^3{}_2SiO)_x-T$$

Wherein $R^3$ each represents an organic radical that may contain one or more functional groups, x represents an integer of at least one, and T is a chain-terminating group such as hydroxyl, alkoxyl, or aminopropyl.

In another embodiment, a moiety suitable to modify the surface of a silica may be an organic aminosilane or silazane of the following formula:

$$(R^4{}_xSi)_y NR^5{}_z H_{(3-y-z)}$$

Wherein, $R^4$ each represents an organic radical that may contain one or more functional groups, x is an integer of from 1 to 3, and y represents a maximum of two silicon atoms bonded to nitrogen. $R^5$ each represents an organic radical bonded that complete the valence state of the amine, and z an integer from 0 to 3. For this formula, the sum of z and y is an integer of at least 1 and less than 4.

The silica surface may also be modified by condensation with alcohols. Suitable alcohols have the general formula:

$$R^6OH$$

Wherein, $R^6$ represents an organic radical that may contain one or more functional groups.

A chemical moiety for use in modifying a silica surface may be structurally assembled fully, then reacted with silica to complete the modification of the silica surface. The silica surface may be modified with a monomeric moiety, which structurally assembles concurrently with a surface modifying reaction by oligomerizing or polymerizing. The silica surface may be modified by reaction with a chemical moiety that contains a reactive functional group, and this functional group may be further reacted with another chemical moiety to complete the surface modification.

The silica surface may be modified by reaction with a chemical moiety that comprises a removal rate modifying group, and additional removal rate modifying groups may be attached by subsequent reactions of the surface-modified silica with the additional groups.

A silica that is surface modified with a chemical moiety that contains a reactive functional group may be further modified by condensation to produce a polymeric surface modified silica. A silica that is surface modified with a chemical moiety that contains a reactive functional group may be further modified by condensation to produce a block-copolymeric surface modified silica. Moreover, a silica that is surface modified with a moiety that contains a reactive functional group may be further modified by atom transfer to produce a polymeric surface modified silica as described in Chemical Communication 2000, 2083.

It is believed that the use of a slurry containing a surface-modified silica for CMP may also reduce the amount of residue that remains on a substrate after post-CMP cleaning. It is believed that the surface modification reduces the interaction between surface-modified silica of the slurry and oxide ILD, compared to unmodified silica, thereby causing the surface-modified silica to be more easily removed.

EXAMPLES

For each of the examples, an additive silicate solution was prepared by diluting commercially available concentrated aqueous potassium silicate with deionized water to the $K_2O$ concentration that is specified in each example. The concentrated aqueous silicate solution generally was received with a composition of 30 weight percent $SiO_2$ and a $SiO_2:K_2O$ molar ratio of 3.25. Unless otherwise specified, the acid used in each of these examples was sulfuric acid.

As used in the present specification and claims, the CTAB surface area of the amorphous precipitated silica is the CTAB surface area determined in accordance the following procedure: using an analytical balance, 11.0 grams (g) of cetyltrimethylammonium bromide, also known as CTAB and as hexadecyltrimethylammonium bromide [CAS 57-09-0], was weighed to the nearest one-tenth milligram and the weight expressed in grams, C, was recorded. The weighed CTAB was dissolved in distilled water and diluted with distilled water to 2 liters in a volumetric flask to form a standard CTAB solution which was stored in the dark for at least 12 days before use. Using an analytical balance, 3.70 grams of Aerosol® OT, sodium di(2-ethylhexyl) sulfosuccinate, [CAS 577-11-7] was weighed. The weighed Aerosol® OT was dissolved in distilled water and diluted with distilled water to 2 liters in a volumetric flask to form a standard Aerosol® OT solution which was stored in the dark for at least 12 days before use. The useful storage lives of the standard CTAB solution and the standard Aerosol®OT solution are two months after the 12 day storage period. Using a pipet, 10.0 milliliters (mL) of the CTAB standard solution was transferred to a 250 mL Erlenmeyer flask containing a stirring bar. Next, 30 mL chloroform, 50 mL distilled water, 15 drops of 0.02% bromophenol blue aqueous indicator solution, and one drop of 1N aqueous NaOH solution were added to the flask. With vigorous stirring but minimal splashing, the contents of the Erlenmeyer flask were titrated with the standard Aerosol® OT solution from a 50 mL buret. The titration was begun at a rapid drop rate (the stopcock was never wide open) down to about 25 to 30 mL and then more slowly, dropwise, to the end point which occurred at about 37.5 mL. The approach to the end point is characterized first by a milky blue color throughout. Then, as the end point was more closely approached, the bottom chloroform layer became a more intense blue and the top aqueous layer took on a lilac or purple hue. Immediately before the end point, the vigorously stirred mixture became visibly clearer (i.e., less "milky"), and the bottom layer was seen as a very intense blue.

Using a wash bottle, the inside of the flask was washed down with no more than 25 mL of distilled water. The stirrer speed was increased to resume vigorous mixing for efficient contacting of the two liquid phases. At least 10 seconds were allowed to elapse after each dropwise addition of titrant immediately prior to the endpoint. Stirring was stopped frequently to allow the phases to separate so that the analyst could observe these color changes and then vigorous stirring was resumed. At the end point, the bottom phase lost all color and displayed a colorless or milky white appearance while the top phase was intensely purple. The titrated volume was recorded to the nearest 0.01 mL. The titration of the standard CTAB solution was performed at least two times (the titrant volume must agree within 0.05 mL) and the average volume of standard Aerosol@ OT solution used per titration, $V_1$, was recorded.

A 200 mL wide mouth glass bottle was tared and approximately 0.500 gram of silica sample (in the as-received state, not dried) was placed in the bottle and weighed to the nearest 0.1 mg. This silica sample weight, S, was recorded. One hundred milliliters of the standard CTAB solution was pipetted into the bottle by using a 50 mL pipet, filling and delivering twice; and a stirring bar was carefully added. The mouth of the bottle as covered with aluminum foil, and the contents were stirred gently for 15 minutes without pH adjustment. Using a pH electrode, the pH was adjusted to between 9.0 and 9.5 using 1N aqueous NaOH added dropwise. When the pH had been stabilized between 9.0 and 9.5, the mouth of the bottle was covered again with aluminum foil or equivalent to retard evaporation loss. The mixture was stirred gently for one hour at pH 9.0 to 9.5. The silica-liquid mixture was transferred to centrifuge tubes, and the mixture was centrifuged for 30 minutes to produce a clear centrifugate. Clear centrifugate was carefully withdrawn using a dropping pipet and transferred to a small, dry glass bottle. Using a pipet, 10.0 mL of the centrifugate was transferred into a 250 mL Erlenmeyer flask containing a stirring bar. Next, 30 mL chloroform, 50 mL distilled water, and 15 drops of 0.02% bromophenol blue aqueous indicator solution were added to the flask. The contents of the Erlenmeyer flask were titrated with the standard Aerosol® OT solution from a 50 mL buret using the same procedure and to the same endpoint used in titrating the standard CTAB solution. The volume of standard Aerosol® OT solution used, $V_2$, was recorded to the nearest 0.01 mL.

A small glass bottle and cap were heated for at least 30 minutes at 105° C. in a vacuum oven. The bottle and cap were then cooled in a desiccator. The bottle and cap were weighed to the nearest 0.1 milligram (mg), as used herein is the tare weight. Approximately one gram of silica sample was added to the bottle, the cap was placed on the bottle, and their combined weight was recorded to the nearest 0.1 mg. The cap was removed and the sample-containing bottle and cap were heated for 30 minutes at 105° C. in a vacuum oven. After introducing vacuum, heating was continued for an additional 30 minutes. The bottle and cap were then cooled in a desiccator. The weight of the bottle containing the sample was recorded to the nearest 0.1 mg. The tare was subtracted from the weight in grams of the silica before heating, A, and the weight in grams of the silica after heating, B.

The CTAB surface area (dry basis), $A_{CTAB}$, expressed in $m^2/g$, was calculated according to the formula:

$$A_{CTAB} = \frac{(V_1 - V_2)(C)(A)(28.92)}{(V_1)(S)(B)}$$

All experiments on 1 inch discs were ran on a Struers Laboforce 3-labopol 5 bench-top CMP tool. The tool was fitted with a Rodel, IC1400-A3 hard pad. Substrates were single component discs acquired from Kamis Inc. The disks measured 23.75 mm in diameter and 6 mm in height. All experiments on 6 inch blank wafers were ran on a IPEC/Westech 372 polisher. The polisher was fitted with a Rodel, IC1400-A2 hard pad. Substrates were 6 inch blank wafers acquired from Montco Silicon Technologies Inc. that measured 150 mm inches in diameter. The Flow rates in all experiments were set at 60 ml/min on Struers Laboforce 3-labopol 5 bench-top CMP tool or 120 ml/min on IPEC/Westech 372 polisher. The pH of the slurries in all experiments was 6.0. Material removal rate (MRR) in nanometer per minute were calculated based on mass loss according to:

$$MRR = \Delta M * 10^{-7}/(\rho * 3.14 * r^2 T)$$

$\Delta M$—the change in mass, (grams)

r—the radius of the disc or wafer, (centimeters)

T—the polishing time, (minutes)

$\rho$—the density of the substrate, (grams/cubic centimeter).

Example 1

Procedure 00-SDH-1451. Silica was prepared by batch precipitation in a 150 liter stirred tank reactor. Water (75 liters) was heated to 205° F., and aqueous potassium silicate (1.2 liters, 109.5 gm $K_2O$/liter) was added. This stirred solution was neutralized to pH 8.5. After 5 minutes, potassium silicate solution (31.7 liters) and concentrated sulfuric acid (1.99 liters) were added simultaneously over a period of 45 minutes. The resulting slurry was allowed to stir at 205° F. for an additional 80 minutes at pH 8.5, then was acidified to pH 4.2 with sulfuric acid. The product slurry was filtered, and water washed. The resulting filter cake was placed in a drum, and later combined with the product from Example 2.

Example 2

A second batch of filtercake was prepared according to the procedure that is described in Example 1. The filtercake product from Example 1 was combined with the filtercake of the present example.

A portion of this combined filtercake was liquefied to 12 weight percent solids with water with a low shear mixer. The resulting liquefied filtercake was pH adjusted to 6.3 and spray dried to produce a white powder having a weight percent moisture 3.70. Analysis of this powder showed the following properties: BET Nitrogen (5-point) 93 m$^2$/g; CTAB 93 m$^2$/g; 245 ml of dibutyl phthalate per 100 gm of anhydrous powder. From these data the average primary particle diameter is calculated to be 29 nanometers. The calculated surface roughness is 1.0.

Particle size reduction was conducted by using a double-jet cell that contained an elongated chamber of alumina reactors (6 reactors, 1 mm ID) and alternating UTHMWPE seals (2.6 mm ID). water was pressurized (45,000 psig) and passed through two nozzles (0.1 mm ID and 0.13 mm ID) to produce water jets that entered this elongated chamber from opposite directions. A portion of spray dried powder (813–958) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry of unmodified silica (BXR-711, 813–968) was 9.16 weight percent solids, and the particle size was characterized by laser light scattering as follows: average 0.218 microns; median 0.179 microns; and 10 volume percent greater than 0.421 microns.

Example 3

Another portion of filtercake, from the combined filtercakes of Example 1 and Example 2, (17.97 kilograms) was liquefied as described in Example 2. This liquefied filtercake was heated to a temperature range of from 65° C. to 85° C. while being combined with dimethyldichlorosilane (0.09 kilograms) and 96 weight percent sulfuric acid (2.22 kilograms) in an in-line mixer immediately prior to being added to a reaction vessel. After aging for about 15 minutes in the reaction vessel, the pH was adjusted to about 4.0 with 45 weight percent aqueous potassium hydroxide. The resulting aqueous suspension of surface-modified silica was filtered and water washed. The resulting filtercake was liquefied by high shear, adjusted to pH 6.3 with ammonium hydroxide, and a portion of this slurry was spray dried to produce a white powder having a weight percent moisture of 3.10 and having 0.29 weight percent carbon.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (813–959) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry of surface-modified silica (BXR-712, 813–971) was 8.43 weight percent solids, and the particle size was characterized by laser light scattering as follows: average 0.223 microns; median 0.184 microns; and 10 volume percent greater than 0.429 microns.

Example 4

Another portion of filtercake, from the combined filtercakes of Example 1 and Example 2, (12.42 kilograms) was liquefied as described in Example 2. This liquefied filtercake was heated to a temperature range of from 65 to 85° C., while being combined with dimethyldichlorosilane (0.09 kilograms) and 96 weight percent sulfuric acid (1.48 kilograms) in an in-line mixer immediately prior to being added to a vessel. After aging for about 15 minutes, the pH was adjusted to about 4.0 with 45 weight percent aqueous potassium hydroxide. The resulting aqueous suspension of treated silica was filtered and water washed. The resulting filtercake was liquefied by high shear, adjusted to pH 6.3 with ammonium hydroxide, and a portion of this slurry was spray dried to produce a white powder (813–960,) having 7.80 weight percent moisture and having 0.79 weight percent carbon.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (813–960) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (BXR-713, 813–972) was 6.86 weight percent solids, and the particle size was characterized by laser light scattering as follows: average 2.127 microns; median 0.278 microns; and 10 volume percent greater than 6.984 microns.

Example 5

Silica was prepared by batch precipitation in a 150 liter stirred tank reactor. Water (75 liters) was heated to 205° F., and aqueous potassium silicate (1.2 liters, 109.5 gm K$_2$O/ liter) was added. This stirred solution was neutralized to pH 8.5. After 5 minutes, potassium silicate solution (31.7 liters) and concentrated sulfuric acid (1.99 liters) were added simultaneously over a period of 45 minutes. Aqueous potassium hydroxide (45 weight percent, 3000 g) was added. The resulting slurry was allowed to stir at 205° F for an additional 80 minutes, then was acidified to pH 4.2 with sulfuric acid. The product slurry was filtered, and water washed. The resulting filter cake was placed in a drum, and later combined with the product from Example 5.

Example 6

A second batch of filtercake was prepared according to the procedure that is described in Example 4. The filtercake product from Example 4 was combined with the filtercake of the present example.

A portion of this combined filtercake was liquefied to 12 weight percent solids with water using a low shear mixer. A portion of this slurry was pH adjusted to 6.3 and spray dried to produce a white powder having a weight percent moisture of 7.70. Analysis of this powder showed the following properties: Nitrogen BET (5-point) 98 $m^2/g$; CTAB 71 $m^2/g$; 251 ml of dibutyl phthalate per 100 gm of anhydrous powder. From these data the average primary particle diameter is calculated to be 38 nanometers. The calculated surface roughness is 1.4.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (813–962) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry of unmodified silica (BXR-714, 813–967) was 8.43 weight percent solids, and the particle size was characterized by laser light scattering as follows: average 0.218 microns; median 0.173 microns; and 10 volume percent greater than 0.428 microns.

Example 7

Another portion of filtercake from the combined filtercakes of examples 4 and 5 (17.10 kilograms) was liquefied as described in Example 5. This liquefied filtercake was heated to a temperature of about 65° C. to 85° C. while being combined with dimethyldichlorosilane (0.08 kilograms) and 96 weight percent sulfuric acid (2.23 kilograms) in an inline mixer immediately prior to being added to a reaction vessel. After aging for about 15 minutes, the pH was adjusted to about 4.0 with 45 weight percent aqueous potassium hydroxide. The resulting aqueous suspension of surface-modified silica was filtered and water washed. The resulting filtercake was liquefied by high shear using a Cawles(™) blade, adjusted to pH 6.3 with ammonium hydroxide, and a portion of this slurry was spray dried to produce a white powder (813–963) having 8.10 weight percent moisture the following properties: 0.29 weight percent carbon.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (813–963) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry of unmodified silica (BXR-715, 813–969) was 8.54 weight percent solids, and the particle size was characterized by laser light scattering as follows: average 4.152 microns; median 0.462 microns; and 10 volume percent greater than 15.22 microns.

Example 8

Another portion of filtercake, from the combined filtercakes of examples 4 and 5, 12.45 kilograms) was liquefied as described in Example 5. This liquefied filtercake was heated to a temperature of from 65° C. to 85° C., while being combined with dimethyldichlorosilane (0.07 kilograms) and 96 weight percent sulfuric acid (1.59 kilograms) in an in-line mixer immediately prior to being added to a reaction vessel. After aging for about 15 minutes, the pH was adjusted to about 4.0 with 45 weight percent aqueous potassium hydroxide. The resulting aqueous suspension of surface-modified silica was filtered and water washed. The resulting filtercake was liquefied by high shear, adjusted to pH 6.3, and a portion of this slurry was spray dried to produce a white powder having 6.50 weight percent moisture the following properties and 0.26 weight percent carbon.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (813–964) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (BXR-716, 813–970) was 7.98 weight percent solids, and the particle size was characterized by laser light scattering as follows: average 0.251 microns; median 0.188 microns; and 10 volume percent greater than 0.482 microns.

Example 9

Another portion of filtercake, from the combined filtercakes of examples 4 and 5, (16.93 kilograms) was liquefied as described in Example 5. This liquefied filtercake was heated to a temperature of about 65° C. to 85° C., while being combined with dimethyldichlorosilane (0.16 kilograms) and 96 weight percent sulfuric acid (2.20 kilograms) in an in-line mixer immediately prior to being added to a vessel. After aging for about 15 minutes, the pH was adjusted to about 4.0 with 45 weight percent aqueous potassium hydroxide. The resulting aqueous suspension of treated silica was filtered and water washed. The resulting filtercake was liquefied by high shear, adjusted to pH 6.3 with ammonium hydroxide, and a portion of this slurry was spray dried to produce a white powder having 6.20 weight percent moisture and 0.78 weight percent carbon. Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (813–965) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry of surface-modified silica (BXR-717, 813–966) was 8.17 weight percent solids, and the particle size was characterized by laser light scattering as follows: average 0.779 microns; median 0.283 microns; and 10 volume percent greater than 2.400 microns.

COMPARATIVE EXAMPLES

Example 10

Slurries from unmodified silica in Example 2 was compared with surface-modified silica from Examples 3 and 4 for polishing copper and tantalum 1-inch disks. Slurry from each example was diluted to prepare slurry for evaluation that comprised of 3 weight percent silica in deionized water. For slurry from each example, polishing was performed at 7.2 psig, 150 RPM, and 60 mL/min slurry flow rate. Weight loss was measured after polishing for 4.5 minutes for each metal disk, and the results are described in Table 1:

TABLE 1

| Slurry from | MRR, nm/min | |
|---|---|---|
| Example | Cu | Ta |
| 2 | 0 | 59 |
| 3 | 6 | 59 |
| 4 | 18 | 46 |

Weight loss was measured after polishing for 9.0 minutes for each metal disk, and the results are described in Table 2:

TABLE 2

| Slurry from | MRR, nm/min | |
|---|---|---|
| Example | Cu | Ta |
| 2 | 9 | 53 |
| 3 | 8 | 52 |
| 4 | 8 | 55 |

These data indicate that tantalum: copper removal rate selectivity is high for slurries from both unmodified silica and surface-modified silica in water. The data for 4.5 minutes appears to indicate that copper removal rates may be effected by the level of surface modification.

Example 11

Slurries from unmodified silica in Example 2 was compared with surface-modified silica from Examples 3 and 4 for polishing copper and tantalum 1-inch disks. Slurry from each example was diluted to prepare slurry for evaluation that comprised of 3 weight percent silica, and 3 weight percent hydrogen peroxide in deionized water. For slurry from each example, polishing was performed at 7.2 psig, 150 RPM, and 60 mL/min slurry flow rate. Weight loss was measured after polishing for 4.5 minutes for each metal disk, and the results are described in Table 3:

TABLE 3

| Slurry from | MRR, nm/min | |
|---|---|---|
| Example | Cu | Ta |
| 2 | 32 | 31 |
| 3 | 16 | 27 |
| 4 | 20 | 28 |

Weight loss was measured after polishing for 9.0 minutes for each metal disk, and the results are described in Table 4:

TABLE 4

| Slurry from | MRR, nm/min | |
|---|---|---|
| Example | Cu | Ta |
| 2 | 24 | 27 |
| 3 | 20 | 22 |
| 4 | 20 | 20 |

These data indicate that tantalum: copper removal rate selectivity is low for slurries from both unmodified silica and surface-modified silica in hydrogen peroxide containing water. The data indicate that copper removal rates may be effected by level of surface modification at shorter polishing times.

Example 12

Slurries from surface-modified silica slurries from Examples 3, and 4 were compared for polishing copper, tantalum, and silicon dioxide 6-inch blanket coated wafers. Slurry from each example was diluted to prepare slurry for evaluation that comprised of 3 weight percent silica, and 3 weight percent hydrogen peroxide in deionized water. For slurry from each example, polishing was performed at 5 psig, 75 RPM, and 120 mL/min slurry flow rate. Weight loss was measured after polishing for 3 minutes for each copper and tantalum wafer. Because weight loss was very low, weight loss was measured after polishing for 9 minutes for each oxide wafer. The results are described in Table 5:

TABLE 5

| Slurry from Example | MRR of Cu Wafer | | MRR of Ta Wafer | | MRR of Oxide Wafer | |
|---|---|---|---|---|---|---|
| | Polish T, min | MRR, nm/min | Polish T, min | MRR, nm.min | Polish T, min | MRR, nm/min |
| 3 | 3 | 32 | 3 | 41 | 9 | 14 |
| 4 | 3 | 45 | 3 | 35 | 9 | 0 |

These data show that while tantalum: copper removal rate selectivity remains low, the metal:silicon dioxide removal rate remains high. These data further show that oxide removal rate is decreased by increasing the level of surface modification of the silica component in the slurry. High metal:silicon dioxide selectivity is desired to prevent erosion of the ILD after the tantalum barrier is removed from a patterned interconnect. The surface quality of the tantalum and oxide wafers was examined after post-CMP cleaning by visual inspection of images created on a Horizon non-contact optical profilometer from Burleigh Instruments (Victor, N.Y.). This instrument uses phase-shifting interferometric technology to provide a non-contact three dimensional measurement of the roughness of the surface from sub-nanometer to microscale. The tantalum wafers were not significantly different in quality when polished with slurries from Examples 3 and 4. However, the silicon dioxide wafers did show a significant difference in surface quality. The wafer polished with slurry comprised of silica from Example 3 was significantly rougher than the wafer polished with slurry comprised from Example 4. These wafers indicate that the amount of residual silica left on the wafer is significantly reduced by increasing the level of surface modification of the silica component in the slurry.

Example 13

Slurries from unmodified silica in Example 5 was compared with surface-modified silica from Examples 6, 7, 8 for polishing copper 1-inch disks. Slurry from each example was diluted to prepare slurry for evaluation that comprised of 3 weight percent silica, 5 weight percent hydrogen peroxide, and 1 weight percent glycine in deionized water. For slurry from each example, polishing was performed at varying pressure, 150 RPM, and 40 mL/min slurry flow rate. Weight loss was measured after polishing for 3.0 minutes for each pressure, and the results are described in Table 6:

TABLE 6

| Pressure PSI | Slurry from Example | | | |
|---|---|---|---|---|
| | 6 | 7 | 8 | 9 |
| | Copper Removal Rate (Å/min) | | | |
| 3.6 | 384 | 320 | 329 | 323 |
| 5.5 | 439 | 384 | 366 | 357 |
| 7.1 | 494 | 448 | 421 | 393 |
| 8.9 | 549 | 521 | 476 | 439 |
| 10.7 | 622 | 613 | 577 | 494 |
| 12.5 | 769 | 695 | 656 | 567 |
| 14.3 | 888 | 805 | 732 | 640 |

These data show that both slurry from unmodified silica (Example 6) and surface modified silica (Examples 7, 8 and 9) give essentially the same Prestonian response for Cu. These results are expected as the copper CMP in this case is slurry-formulation dependent, and the silica surface modification is relatively unimportant.

Example 14

Slurries from unmodified silica from Example 6 and surface-modified silica slurries from Example 6 were compared for polishing tantalum 6-inch blanket wafers. Slurry from each example was diluted to prepare slurry for evaluation that comprised of 3 weight percent silica in deionized water. For slurry from each example, polishing was performed at varying pressure, 50 RPM, and 120 mL/min slurry flow rate. Change in tantalum film thickness was measured after polishing for 3 minutes for each tantalum wafer by using a 4-point probe.

The thickness of thin metal films is measured by using the four point probe. It consists of four collinear probes. A constant current is passed between the two outer probes and the potential between the inner two probes is recorded using a voltmeter. From the current (I) and voltage (V) values, the sheet resistance of the film ($R_s$) can be calculated according to the equation, $$R_s = VX/I$$

Where, X is a correction factor which comes into the equation because the distance between the probe(s) is very much less than the diameter of the specimen (d)., i.e., s<<d. In this case, s<<d, the correction factor is 4.532. Hence, the film thickness, t, can be calculated according to the equation:

$$T = \rho/R_s$$

The thickness of the film was measured at 17 different points on the wafer the center point, 8 points (equally spaced) which are at a distance of 3 centimeters from the center and 8 points (equally spaced) which are at a distance of 6 centimeters from the center. The film thickness was measured before and after polishing at these 17 different points so that the polish rate can be calculated at all these points. The polish rates reported were averaged over 17 points.

The results are described in Table 7:

TABLE 7

| | Slurry from Example | |
|---|---|---|
| | 6 | 7 |
| Pressure | MRR (Å/min) | |
| 3.0 | 48 | 32 |
| 4.0 | 81 | 40 |
| 4.5 | 92 | 47 |
| 5.0 | 134 | 58 |
| 5.5 | 136 | 91 |
| 6.0 | 175 | 145 |

These data indicate that tantalum removal rate rises with pressure with Prestonian behavior for the slurry prepared from unmodified silica of Example 6. However, slurry from surface-modified silica from Example 7 does not follow Prestonian behavior. Below about 5 psig tantalum removal rates lag below that of the unmodified silica containing slurry. Above about 5 psig, tantalum removal rate rises sharply for the slurry of Example 7.

Figure 3:
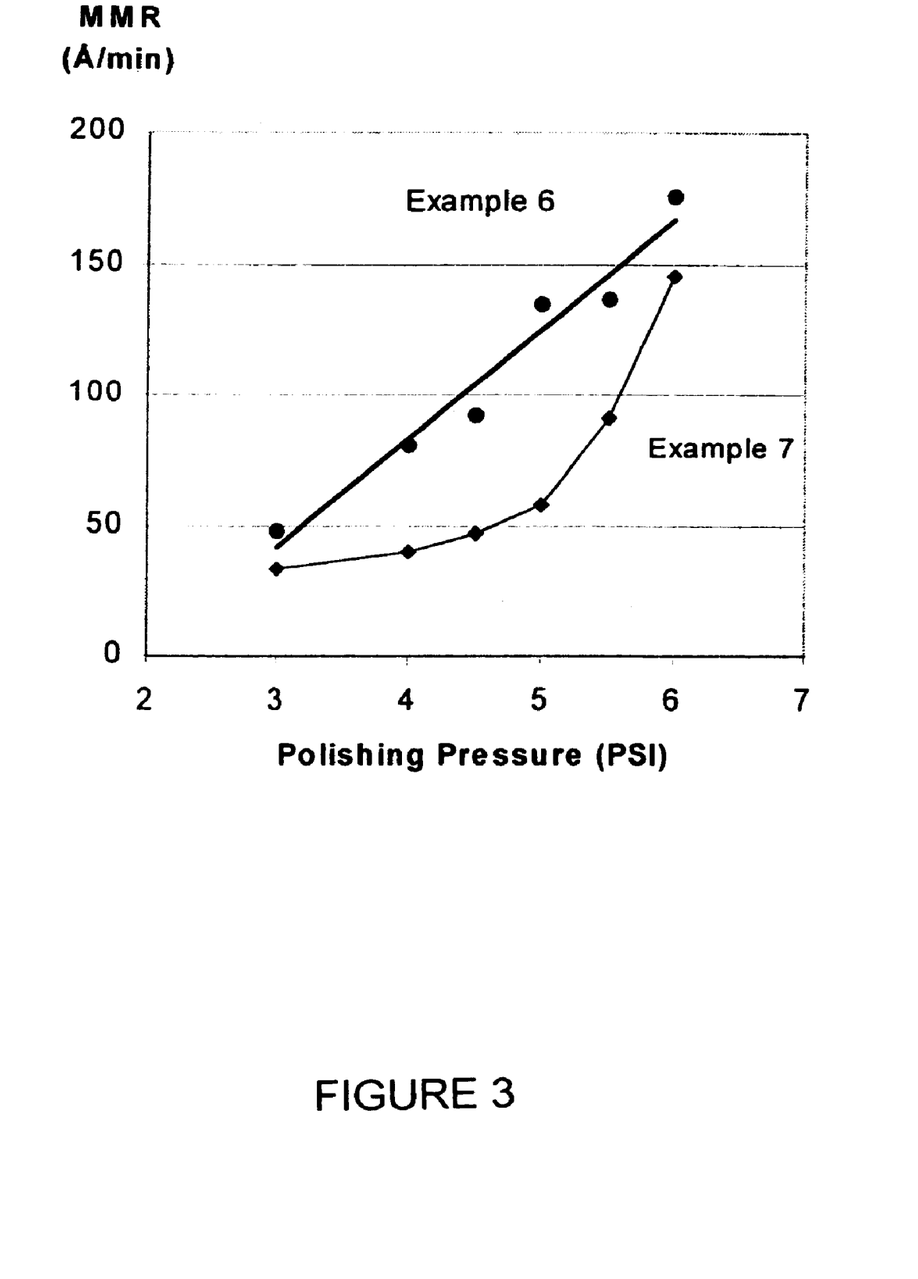
FIG. 3 provides comparative data representative of material removal rates for tantalum polishing using an unmodified silica slurry and a surface-modified silica slurry.

The relative behaviors of slurries from Examples 6 and 7 is further illustrated by the chart in FIG. 3.

What is claimed is:

1. A slurry for polishing a microelectronic substrate, said slurry comprising surface-modified silica wherein said surface-modified silica comprises silica comprising an aggregate of primary particles, said aggregate having a size of less than five (5) microns, and wherein said silica has a hydroxyl content of 7 or greater hydroxyls per nanometer squared of surface area.

2. The slurry of claim 1 wherein said surface-modified silica comprises silica modified with at least one material selected from an organic group, an organometallic group, or mixtures thereof.

3. The slurry of claim 2 wherein said surface-modified silica comprises silica modified with an organosilane.

4. The slurry of claim 3 wherein said surface-modified silica comprises silica modified with dimethyidichlorosilane.

5. The slurry of claim 1 wherein said aggregate has an aggregate size of less than one (1) micron.

6. The slurry of claim 1 wherein said aggregate has an aggregate size of less than one-half (0.5) micron.

7. The slurry of claim 1 wherein said slurry provides a removal of copper, tantalum and silicon dioxide from said microelectronic substrate.

8. The slurry of claim 7 wherein rate of removal of tantalum to silicon dioxide is greater than 2.

9. The slurry of claim 7 wherein rate of removal of tantalum to copper is at least 1.

10. The slurry of claim 1 wherein said surface-modified silica comprises precipitated silica.

11. The slurry of claim 10 wherein said precipitated silica comprises an aggregate that can be reduced to an aggregate size of less than five (5) microns.

12. The slurry of claim 11 wherein said aggregate is capable of being reduced to said aggregate size by a wet milling process.

13. The slurry of claim 1 wherein said surface-modified silica comprises said silica and at least one material covalently bonded to said silica.

14. A slurry for removal of copper, tantalum and silicon dioxide from a microelectronic substrate, said slurry comprising surface-modified silica and wherein said surface-modified silica further comprises a silica comprising a hydroxyl content of 7 or greater hydroxyls per nanometer squared of surface area.

15. The slurry of claim 14 wherein said silica further comprises an aggregate of primary particles.

16. The slurry of claim 15 wherein said aggregate has an aggregate size of less than five (5) microns.

17. The slurry of claim 15 wherein said aggregate has an aggregate size of less than one (1) micron.

18. The slurry of claim 15 wherein said aggregate has an aggregate size of less than one-half (0.5) micron.

19. The slurry of claim 16 wherein said silica further comprises a hydroxyl content of 10 or greater hydroxyls per nanometer squared of surface area.

20. The slurry of claim 14 wherein said surface-modified silica comprises silica modified with a material selected from an organic group, an organometallic group, or mixtures thereof.

21. The slurry of claim 14 wherein said surface-modified silica comprises silica modified with an organosilane.

22. The slurry of claim 14 wherein said surface-modified silica comprises silica modified with dimethyldichlorosilane.

23. The slurry of claim 14 wherein said slurry provides a removal of copper, tantalum and silicon dioxide from said microelectronic substrate.

24. The slurry of claim 23 wherein rate of removal of tantalum to silicon dioxide is greater than 2.

25. The slurry of claim 23 wherein rate of removal of tantalum to copper is at least 1.

26. The slurry of claim 14 wherein said surface-modified silica comprises precipitated silica.

27. A slurry for removal of copper, tantalum and silicon dioxide from a microelectronic substrate, said slurry comprising surface-modified silica, wherein removal rate of tantalum increases essentially non-linearly as polishing pressure increases at essentially constant velocity and wherein said surface-modified silica further comprises a silica comprising a hydroxyl content of 7 or greater hydroxyls per nanometer squared of surface area.

28. A slurry for removing at least one material chosen from copper, tantalum and silicon dioxide, from a microelectronic substrate, said slurry comprising silica modified by a chemical moiety, to produce a non-Prestonian removal rate and wherein said silica further comprises a hydroxyl content of 7 or greater hydroxyls per nanometer squared of surface area.

29. A method for polishing a microelectronic substrate comprising applying to said substrate a slurry comprising surface-modified silica wherein said surface-modified silica comprises silica comprising an aggregate of primary particles, said aggregate having a size of less than five (5) microns, and wherein said silica has a hydroxyl content of 7 or greater hydroxyls per nanometer squared of surface area.

* * * * *

UNITED STATES PATENT AND TRADEMARK OFFICE
CERTIFICATE OF CORRECTION

PATENT NO.      : 6,656,241 B1
DATED           : December 2, 2003
INVENTOR(S)     : Stuart D. Hellring et al.

It is certified that error appears in the above-identified patent and that said Letters Patent is hereby corrected as shown below:

<u>Title page,</u>
Item [54], Title, delete "SILICA-BASED SLURRY" and insert -- A SILICA-BASED SLURRY --.

<u>Column 28,</u>
Line 40, delete "dimethyidichlorosilane" and insert -- dimethyldichlorosilane --.

Signed and Sealed this

Thirteenth Day of December, 2005

JON W. DUDAS
*Director of the United States Patent and Trademark Office*